(12) United States Patent
Lee (10) Patent No.: US 7,619,454 B2
(45) Date of Patent: *Nov. 17, 2009

(54) CLOCK GENERATOR FOR SEMICONDUCTOR MEMORY APPARATUS

(75) Inventor: Hyun-Woo Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/185,855

(22) Filed: Aug. 5, 2008

(65) Prior Publication Data

US 2008/0290919 A1  Nov. 27, 2008

Related U.S. Application Data

(63) Continuation of application No. 11/605,463, filed on Nov. 29, 2006, now Pat. No. 7,414,451.

(30) Foreign Application Priority Data

Dec. 28, 2005  (KR) .................... 10-2005-0131432

(51) Int. Cl.
H03L 7/00  (2006.01)
(52) U.S. Cl. .................. 327/161; 327/149; 327/153; 327/293; 327/295
(58) Field of Classification Search .............. 327/149, 327/152, 153, 158, 161, 165, 166, 291–296, 327/298, 299
See application file for complete search history.

(56) References Cited

U.S. PATENT DOCUMENTS 6,269,051 B1 * 7/2001 Funaba et al. .......... 365/233.11

| 6,384,652 | B1 | 5/2002 | Shu |
| 6,433,597 | B2 * | 8/2002 | Jung .......... 327/158 |
| 6,492,852 | B2 * | 12/2002 | Fiscus .......... 327/158 |
| 6,593,786 | B2 * | 7/2003 | Jung .......... 327/158 |
| 6,853,225 | B2 | 2/2005 | Lee |
| 6,859,081 | B2 | 2/2005 | Hong et al. |
| 6,934,215 | B2 | 8/2005 | Chung et al. |
| 6,963,235 | B2 | 11/2005 | Lee |

(Continued)

FOREIGN PATENT DOCUMENTS

JP   2001-005554   1/2001

(Continued)

Primary Examiner—Lincoln Donovan
Assistant Examiner—William Hernandez
(74) Attorney, Agent, or Firm—Venable LLP; Jeffri A. Kaminski (57) ABSTRACT

The clock generator for semiconductor memory apparatus which includes: a first divider configured to divide a frequency of a first internal clock generated by using an external clock; a first delay unit configured to delay an output of the first divider by first delay time; a second divider configured to divide a frequency of an output of the first delay unit; a second delay unit configured to delay the output of the second divider by second delay time; a phase comparator configured to compare a phase of the output of the first divider with a phase of the output of the second delay unit and output a result of the comparison; and a delay time setting unit configured to set the first delay time on the basis of the output of the phase comparator.

10 Claims, 7 Drawing Sheets

U.S. PATENT DOCUMENTS

| | | | |
|---|---|---|---|
| 7,227,809 B2 * | 6/2007 | Kwak | 365/189.15 |
| RE40,205 E * | 4/2008 | Funaba et al. | 365/194 |
| 7,436,230 B2 * | 10/2008 | Kim | 327/158 |
| 2004/0066873 A1 | 4/2004 | Cho et al. | |
| 2005/0242854 A1 * | 11/2005 | Kang et al. | 327/158 |

FOREIGN PATENT DOCUMENTS

| | | |
|---|---|---|
| JP | 2001-237680 | 8/2001 |
| KR | 1020040021478 | 3/2004 |
| KR | 1020040046323 | 6/2004 |

* cited by examiner

CLOCK GENERATOR FOR SEMICONDUCTOR MEMORY APPARATUS

This application is a continuation of U.S. patent application Ser. No. 11/605,463, filed Nov. 29, 2006, the subject matter of which application is incorporated herein by reference in its entirety.

BACKGROUND OF THE INVENTION

1. Technical Field

The present invention relates to a semiconductor memory apparatus. In particular, the present invention relates to a clock generator for a semiconductor memory apparatus.

2. Related Art

In general, a DLL (Delay Locked Loop) is a clock generator compensating for a skew between an external clock and data or between an external clock and an internal clock.

Figure 1:
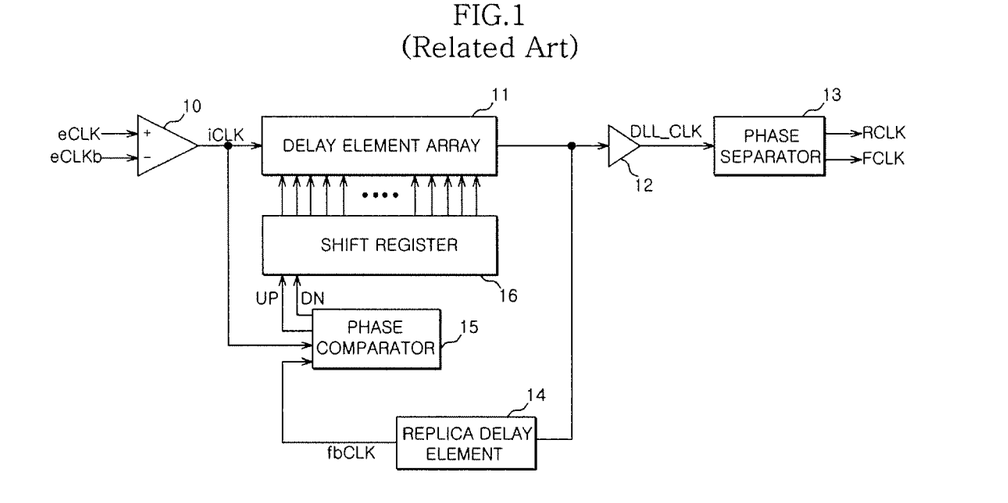
FIG. 1 is a block diagram showing the configuration of a clock generator for a semiconductor memory apparatus according to the related art.

A clock generator according to the related art includes a clock receiver 10, a delay element array 11, a buffer 12, a phase separator 13, a replica delay element 14, a phase comparator 15, and a shift register 16, as shown in FIG. 1.

The clock receiver 10 receives external clock eCLK and inverted external clock eCLKb having phase opposite to the external clock and outputs an internal clock iCLK.

The delay element array 11 is composed of a plurality of delay elements. The delay element array 11 delays the internal clock iCLK by a delay time of a delay element selected according to the external control and outputs the delayed internal clock.

The buffer 12 buffers and outputs the output of the delay element array 11.

The phase separator 13 separates the output of the buffer 12 into clocks RCLK and FCLK that have a phase difference of 180° therebetween.

The replica delay element 14 is a delay element modeled on the time required to read out data from a corresponding semiconductor memory apparatus. The replica delay element 14 delays the clock output from the delay element array 11 by a predetermined amount of time and outputs the delayed clock fbCLK.

The phase comparator 15 compares the phase of the internal clock iCLK output from the clock receiver 10 with the phase of the clock output fbCLK from the replica delay element 14 and outputs an up signal UP or a down signal DN to coincide the phase of the iCLK with the phase of the fbCLK.

When the shift register 16 receives the up signal, the shift register 16 causes a delay element having a longer delay time than the previous delay element to be selected from the delay element array 11. When the shift register 16 receives the down signal, the shift register 16 causes a delay element having a shorter delay time than the previous delay element to be selected from the delay element array 11.

Then, the delay element array 11 delays the internal clock iCLK by the delay time of the delay element selected by the shift register 16, and outputs the delayed internal clock iCLK.

As described above, the phase comparison process and the delay time adjusting process through the delay element array 11, the replica delay element 14, the phase comparator 15, and the shift register 16 are repeated such that the buffer 12 outputs a phase-fixed clock DLL_CLK, thereby compensating for the skew between the external clock eCLK and the internal clock iCLK.

In the clock generator for a semiconductor memory apparatus according to the related art, a clock period becomes shorter as the speed of the operation of the semiconductor memory apparatus becomes higher, which causes a problem in that it is difficult to correct the phase of the clock, and thus a clock generating error frequently occurs. In addition, the related art has a problem in that the reliability of the clock is lowered due to the frequent clock errors and a system using the clock generator may operate incorrectly.

SUMMARY OF THE INVENTION

Embodiments of the present invention have been finalized in order to solve the above-described problems, and provide a clock generator for a semiconductor memory apparatus capable of generating a stable and reliable clock.

According to an embodiment of the present invention, a clock generator for a semiconductor memory apparatus includes: a first divider configured to divide a frequency of a first internal clock generated by using an external clock; a first delay unit configured to delay an output of the first divider by first delay time; a second divider configured to divide a frequency of an output of the first delay unit; a second delay unit configured to delay the output of the second divider by second delay time; a phase comparator configured to compare a phase of the output of the first divider with a phase of the output of the second delay unit and output a result of the comparison; and a delay time setting unit configured to set the first delay time on the basis of the output of the phase comparator.

BRIEF DESCRIPTION OF THE DRAWINGS

The above and other features and advantages of the present invention will become more apparent by describing in detail preferred embodiments thereof with reference to the attached drawings in which.

DESCRIPTION OF EXEMPLARY EMBODIMENT

Hereinafter, a clock generator for a semiconductor memory apparatus according to a preferred embodiment of the present invention will be described with reference to the accompanying drawings.

Figure 2:
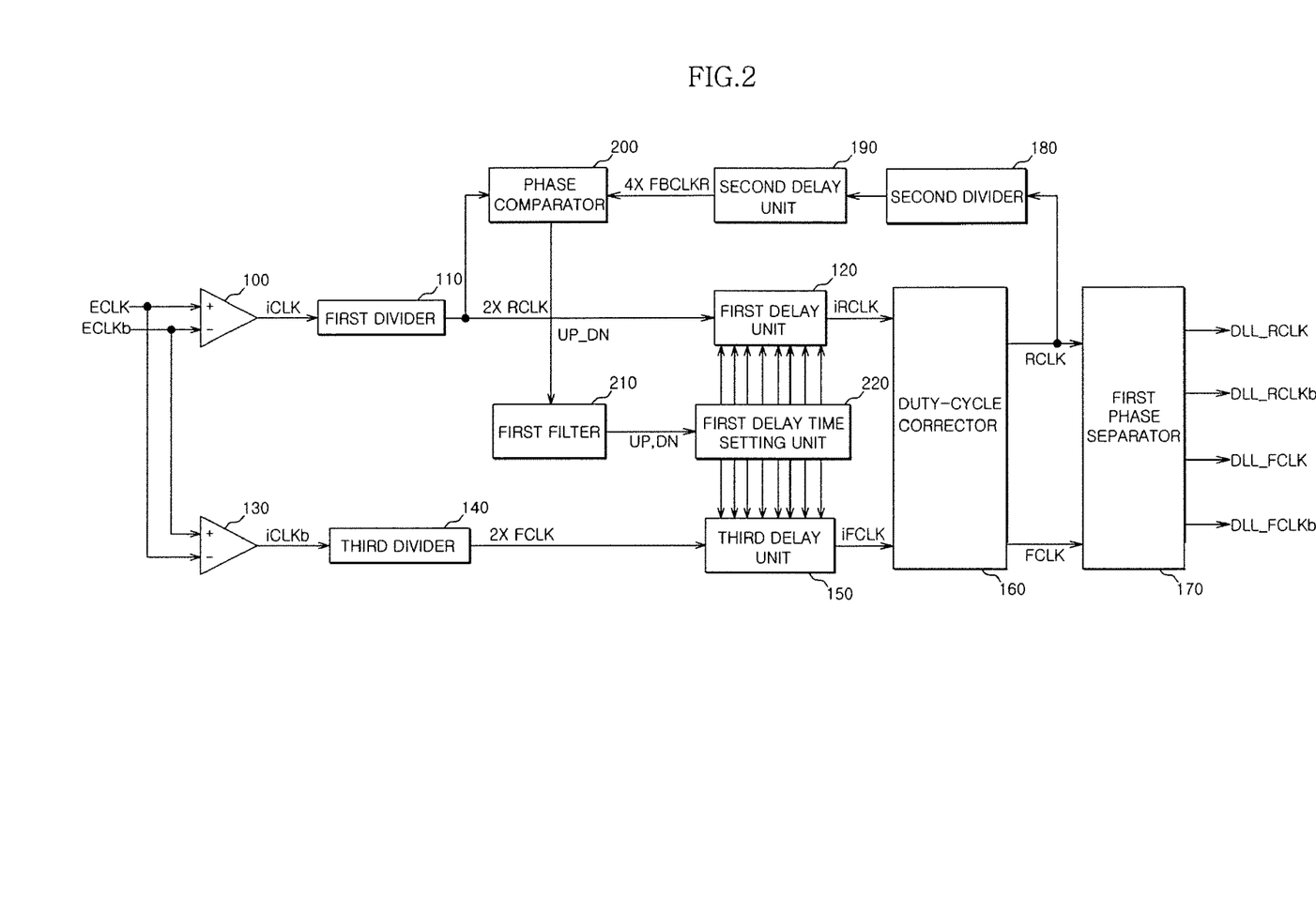
FIG. 2 is a block diagram showing the configuration of a clock generator for a semiconductor memory apparatus according to an embodiment of the present invention.

As shown in FIG. 2, the clock generator for a semiconductor memory apparatus includes: a first clock receiver 100 receiving an external clock ECLK, ECLKb, and outputting a first internal clock which is delayed a predetermined amount of time by the external clock ECLK; a first divider 110 dividing the frequency of the first internal clock; a first delay unit 120 delaying the output of the first divider 110 by a predetermined amount of time; a second clock receiver 130 receiving the external clock ECLK, ECLKb, and outputting a second internal clock which is delayed a predetermined amount of time by the external clock ECLKb; a third divider 140 dividing the frequency of the second internal clock; a third delay unit 150 delaying the output of the third divider 140 by a predetermined amount of time; a duty-cycle corrector 160 correcting the duty cycles of the outputs of the first and second delay units 120 and 150 and outputting the corrected outputs as first corrected clock RCLK and second corrected clock FCLK; a first phase separator 170 separating each of the first and second corrected clocks into two clocks having phases opposite to each other and outputting the separated clocks; a second divider 180 dividing the frequency of the first corrected clock; a second delay unit 190 delaying the output of the second divider 180 by a predetermined amount of time; a phase comparator 200 comparing the phase of the output of the second delay unit 190 and the phase of the output of the first divider 110 and outputting the comparison result; a first filter 210 performing a filtering operation for stabilizing the output of the phase comparator 200; and a first delay time setting unit 220 setting delay times of the first and second delay units 120 and 150 on the basis of the output of the first filter 210.

The first divider 110, the third divider 140, and the second divider 180 are configured to divide a frequency of an input signal by two.

The first delay unit 120 is a delay element array composed of a plurality of delay elements having different delay times, and the third delay unit 150 has the same configuration as the first delay unit 120.

Figure 3:
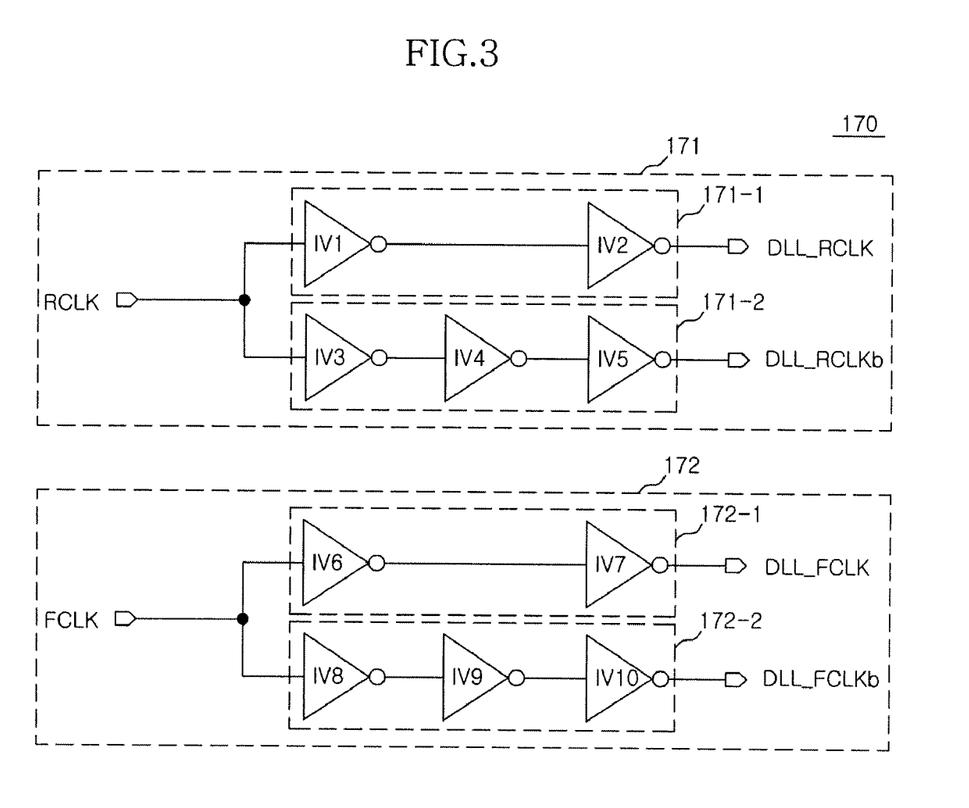
FIG. 3 is a circuit diagram showing the configuration of a first phase separator shown in FIG. 2.

Turning now to FIG. 3, the first phase separator 170 includes a first block 171 separating the first corrected clock RCLK into a positive phase clock DLL_RCLK and a negative phase clock DLL_RCLKb which is inverted by the positive phase clock DLL_RCLK and outputting the clocks DLL_RCLK and DLL_RCLKb, and a second block 172 separating the second corrected clock FCLK into a positive phase clock DLL_FCLK and a negative phase clock DLL_FCLKb which is inverted by the positive phase clock DLL_FCLK and outputting the clocks DLL_FCLK and DLL_FCLKb.

The first block 171 includes a first inverter chain 171-1 composed of an even number of inverters IV1 and IV2 and a second inverter chain 171-2 composed of an odd number of inverters IV3, IV4, and IV5. The input terminals of the first and second inverter chains 171-1, 171-2 are connected to each other. Similarly, the second block 172 includes a third inverter chain 172-1 composed of an even number of inverters IV6 and IV7 and a fourth inverter chain 172-2 composed of an odd number of inverters IV8, IV9, and IV10. The input terminals of the third and fourth inverter chains 172-1, 172-2 are connected to each other. The number of inverters in the first block 171 or second block 172 is just an example, and may be changed according to the circuit characteristics. The first to fourth inverter chains 171-1 to 172-2 are configured to have the same input/output delay time.

The second delay unit 190 is a delay element modelled on the time required to read out data from the semiconductor memory apparatus.

The first delay time setting unit 220 is composed of a shift register.

Figure 4:
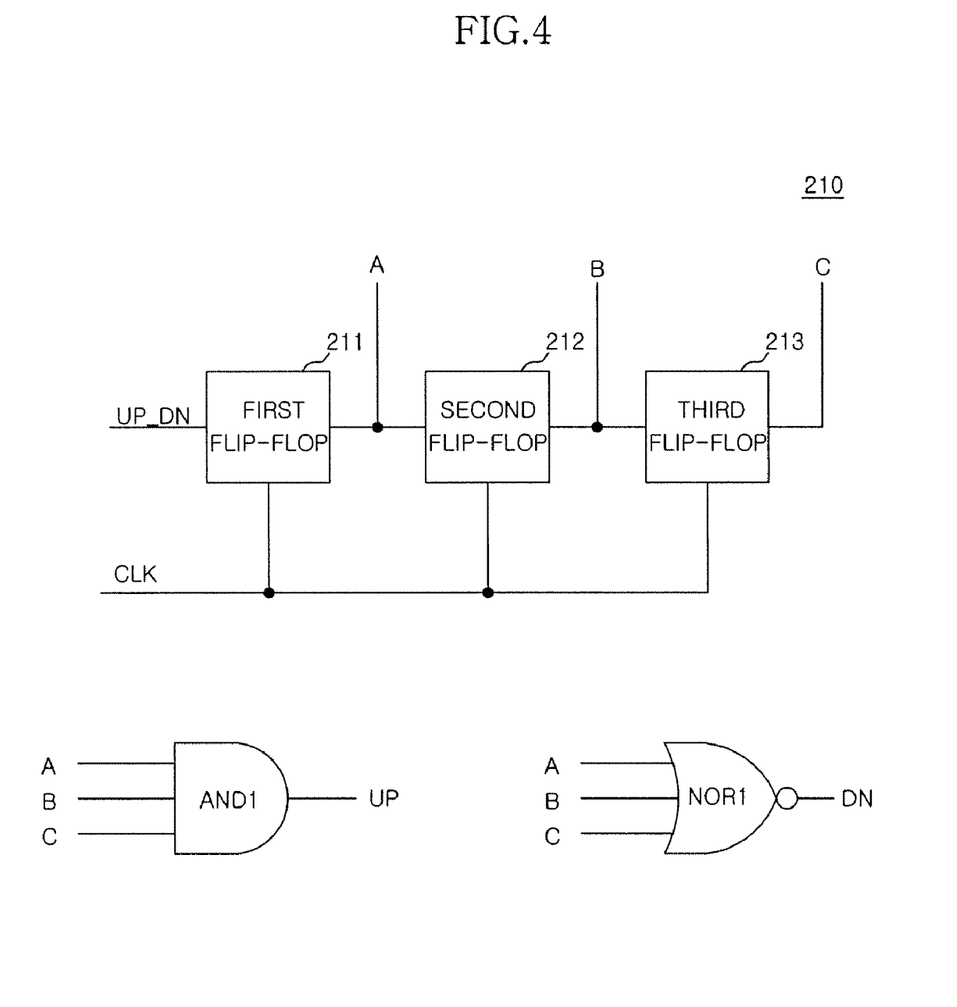
FIG. 4 is a circuit diagram showing a first LPF shown in FIG. 2.

As shown in FIG. 4, the first filter 210 includes first to third flip-flops 211 to 213 operating according to a predetermined clock CLK, a first logic element AND1 performing an AND operation of the outputs A-C of the first to third flip-flops 211 to 213, and a second logic element NOR1 performing a NOR operation on the outputs A-C of the first to third flip-flops 211 to 213.

Figure 5:
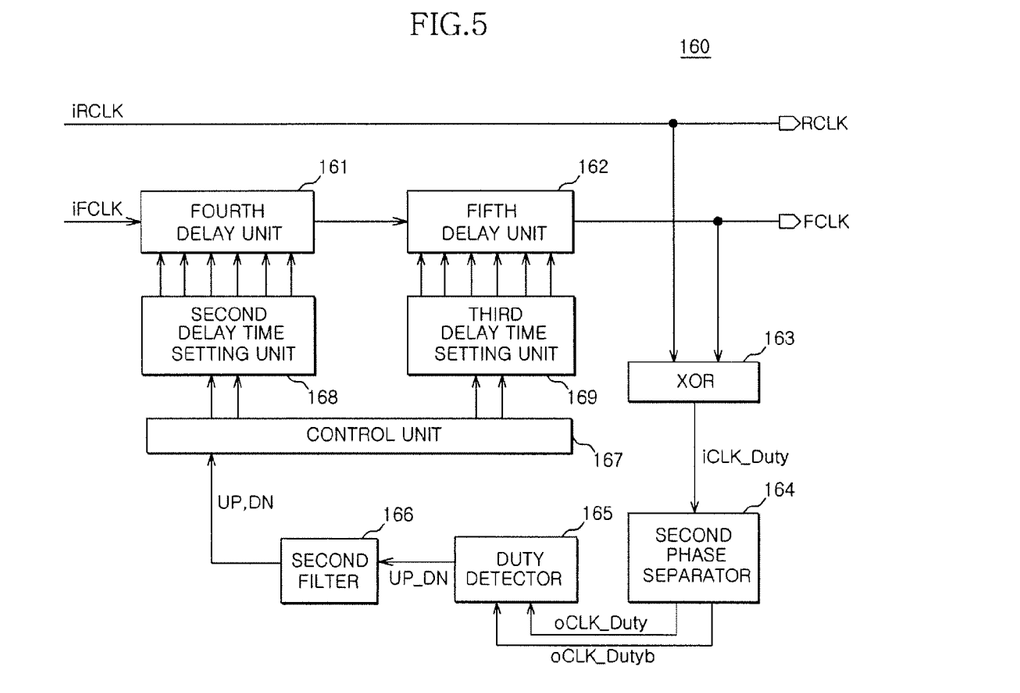
FIG. 5 is a block diagram showing the configuration of a duty-cycle corrector shown in FIG. 2.

As shown in FIG. 5, the duty-cycle corrector 160 includes: a fourth delay unit 161 delaying the output of the third delay unit 150 shown in FIG. 2 by a predetermined amount of time; a second delay time setting unit 168 setting the delay time of the fourth delay unit 161; a fifth delay unit 162 delaying the output of the fourth delay unit 161 by a predetermined amount of time; a third delay time setting unit 169 setting the delay time of the fifth delay unit 162; an XOR logic element 163 performing an XOR operation of the output of the fifth delay unit 162 and the output of the first delay unit 120 shown in FIG. 2; a second phase separator 164 separating the output of the XOR logic element 163 into a positive phase clock oCLK_Duty and a negative phase clock oCLK_Dutyb and outputting the clocks oCLK_Duty and oCLK_Dutyb; a duty detector 165 comparing the duties of the clocks oCLK_Duty and oCLK_Dutyb output from the second phase separator 164 and outputting the comparison result UP_DN; a second filter 166 stabilizing the output of the duty detector 165 and outputting the stabilized output; and a control unit 167 selectively controlling the second delay time setting unit 168 and the third delay time setting unit 169 on the basis of the output of the second filter 166.

Each of the fourth delay unit 161 and the fifth delay unit 162 is a delay element array composed of a plurality of delay elements having different delay times. The difference between any two of the delay elements of the fourth delay unit 161 is larger than the difference between any two of the delay elements of the fifth delay unit 162. In other words, the fourth delay unit 161 is for adjusting a longer delay time, and the fifth delay unit 162 is for adjusting a delay time shorter than that of the fourth delay unit 161.

The second phase separator 164 has the same configuration as the first block 171 shown in FIG. 3.

Each of the second and third delay time setting units 168 and 169 is composed of a shift register.

Figure 6:
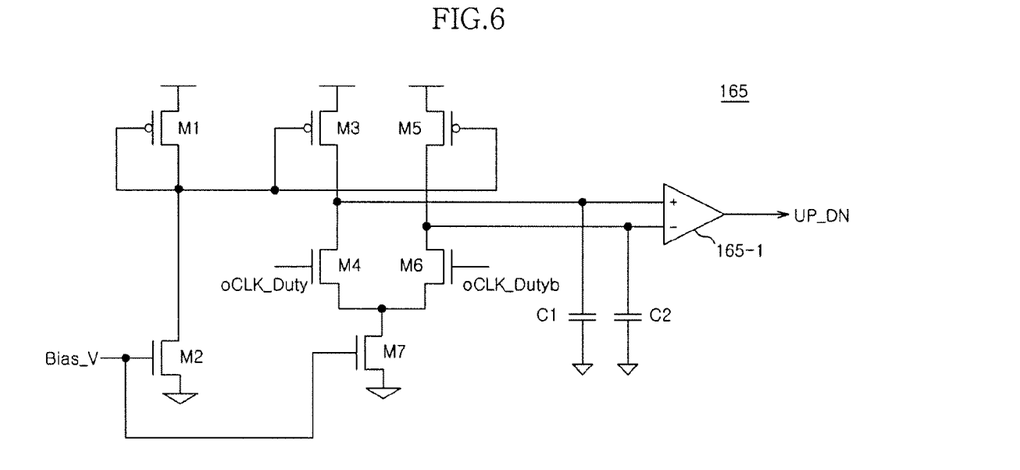
FIG. 6 is a circuit diagram showing the configuration of a duty detector shown in FIG. 5.

As shown in FIG. 6, the duty detector 165 uses a comparator to compare the duties of the clocks oCLK_Duty and oCLK_Dutyb output from the second phase separator 164 by using the difference between the phases thereof and outputs a signal UP_DN for increasing or decreasing the delay times of the delay units on the basis of the difference between the duties such that the duties of the clocks oCLK_Duty and oCLK_Dutyb are identical with each other.

The second filter 166 has the same configuration as the first filter 210 shown in FIG. 4.

Figure 7:
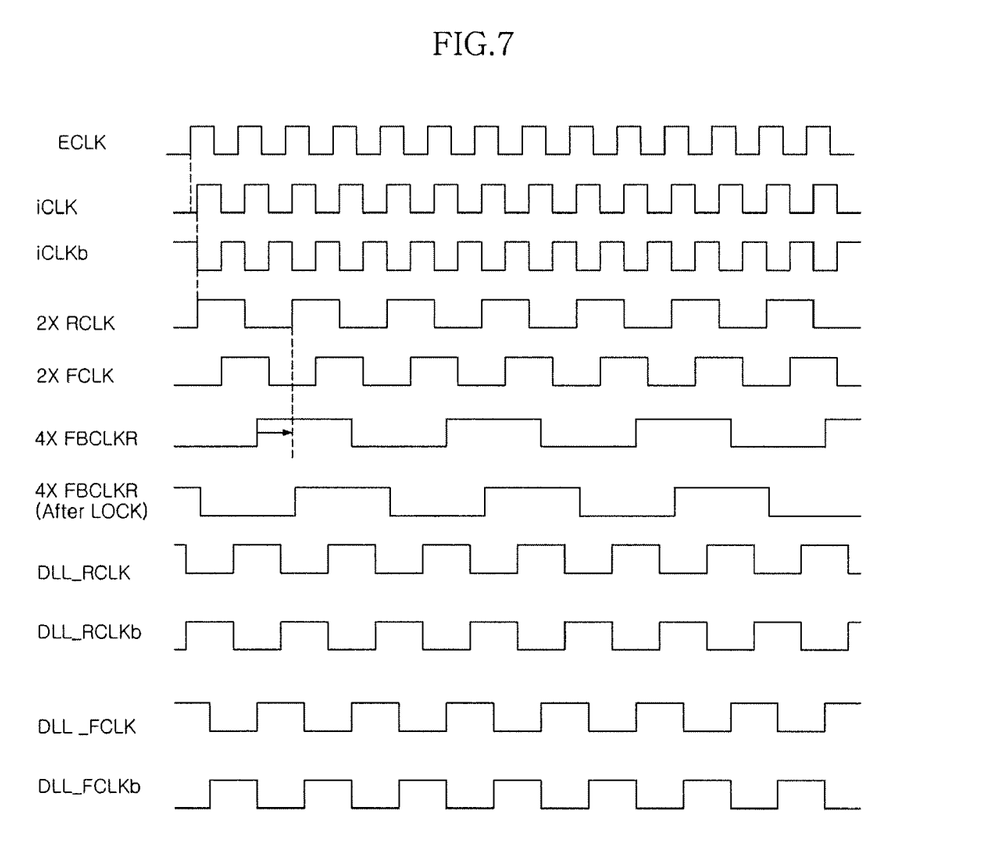
FIG. 7 is a timing chart illustrating the operation of the clock generator of a semiconductor memory apparatus according to an embodiment of the present invention.

The operation of the clock generator for a semiconductor memory apparatus according to an embodiment of the present invention having the above-mentioned configuration will now be described with reference to a timing chart shown in FIG. 7.

First, internal clocks iCLK and iCLKb generated according to external clocks ECLK, ECLKb are input to the first and second dividers 110 and 140. The first and second dividers 110 and 140 divide the frequency of internal clocks iCLK and iCLKb to generate clocks 2X RCLK and 2X FCLK, respectively. The clocks 2X RCLK and 2X FCLK are input to the first and second delay units 120 and 150. The first and second delay units 120 and 150 delay the clocks 2X RCLK and 2X FCLK and outputs the delayed clocks to the duty-cycle corrector 160 as clocks iRCLK and iFCLK.

The delay times of the first and second delay units 120 and 150 are set to the same value by the first delay time setting unit 220. In an initial operation of the clock generator, an initial delay time is set by the first delay time setting unit 220.

Next, the duty-cycle corrector 160 corrects the difference between the duties of the clocks iRCLK and iFCLK and outputs the corrected clocks to the first phase separator 170 as clocks RCLK and FCLK.

The first phase separator 170 separates the clock RCLK into clocks DLL_RCLK and DLL_RCLKb having phases opposite to each other and simultaneously separates the clock FCLK into clocks DLL_FCLK and DLL_FCLKb having phases opposite to each other, and outputs the clocks DLL_RCLK, DLL_RCLKb, DLL_FCLK and DLL_FCLKb.

The first phase separator 170 disclosed is selected to meet the requirements of the next circuit in order to output four clocks from the clock generator according to the embodiment of the present invention, unlike a configuration in which two clocks are output from the phase separator 13 of the related art as shown FIG. 1. The invention contemplates phase separators having different numbers of inputs, as well as omission of the phase separator. The clock generator according to an embodiment of the present invention essentially includes the above-mentioned components except for the first phase separator 170, and may further include at least one of the same components as the first phase separator 170 in order to provide various clocks, if necessary.

Meanwhile, the clock RCLK output from the duty-cycle corrector 160 is input to the second divider 180. The second divider 180 divides the clock RCLK by two and outputs the frequency-divided clock to the second delay unit 190. The second delay unit 190 delays the frequency-divided clock by the time required to read out data from a semiconductor memory apparatus and outputs the delayed clock to the phase comparator 200.

The phase comparator 200 compares the phase of the output of the second delay unit 190 with the phase of the output of the first divider 110, and outputs a signal UP_DN for increasing or decreasing the delay times of the first and second delay units 120, 150 on the basis of the comparison result.

That is, the phase comparator 200 compares the phase of the clock 4X FBCLKR output from the second delay unit 190 with the phase of the clock 2X RCLK output from the first divider 110. A phase correction makes the rising edge of the clock 4X FBCLKR coincide with the rising edge of the clock 2X RCLK. In the related art, as shown in FIG. 1, a delayed clock fbclk having the same cycle as an external clock eCLK is compared to the external clock eCLK. However, in this embodiment of the invention, since the frequency-divided clock is used instead of the delayed clock having the same cycle as an external clock, an exact comparison between phases is possible.

The output of the phase comparator 200 is input to the first delay time setting unit 220 through the first filter 210. The first delay time setting unit 220 increases or decreases the delay times of the first and second delay units 120 and 150 equally on the basis of the output of the phase comparator 200, thereby performing phase correction.

The duty-cycle corrector 160 continuously performs an operation of correcting the difference between the duties of the clocks iRCLK and iRCLKb and outputting the corrected clocks RCLK and FCLK, which makes it possible to generate clocks having the same phase and duty regardless of a variation in the external clock ECLK.

Figure 8:
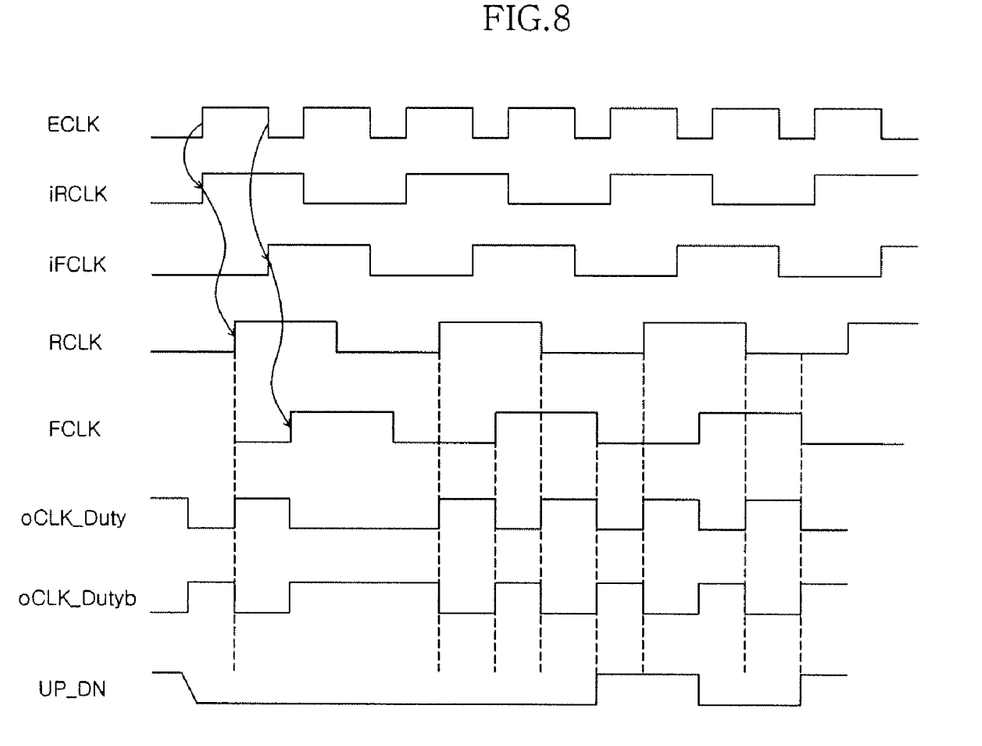
FIG. 8 is a timing chart illustrating the operation of the duty-cycle corrector shown in FIG. 2.

The operation of the duty-cycle corrector 160 will now be described with reference to the timing chart of FIG. 8.

First, the XOR logic element 163 receives the clocks RCLK and FCLK, performs an XOR operation on them, and outputs the operation result iCLK_Duty to the second phase separator 164.

The second phase separator 164 separates the clock iCLK_Duty into clocks oCLK_Duty and oCLK_Dutyb having phases opposite to each other.

When the difference between the phases of the clocks RCLK and FCLK occurs due to delay, the width of the high level of each of the clocks oCLK_Duty and oCLK_Dutyb is different from the width of the low level thereof. The duty detector 165 detects the difference between the widths, and the control unit 167 controls the second and third delay time setting units 168 and 169 to adjust the delay times of the fourth and fifth delay units 161, 162 so that the duties of the clocks RCLK and FCLK are equal to each other.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

The clock generator for a semiconductor memory apparatus according to an embodiment of the present invention performs phase correction and duty cycle correction using frequency-divided clocks. Therefore, it is possible to generate reliable clocks and to improve the operational performance of a system using the clock generator.

What is claimed is:

1. A clock generator for a semiconductor memory apparatus, comprising:
   a first divider configured to divide a frequency of a first internal clock generated by using an external clock;
   a first delay unit configured to delay an output of the first divider by first delay time;
   a second divider configured to divide a frequency of an output of the first delay unit;
   a second delay unit configured to delay the output of the second divider by second delay time;
   a phase comparator configured to compare a phase of the output of the first divider with a phase of the output of the second delay unit and output a result of the comparison; and
   a delay time setting unit configured to set the first delay time on the basis of the output of the phase comparator.

2. The apparatus of claim 1, further comprising:
   a third divider configured to divide a frequency of a second internal clock generated by using the external clock,
   a third delay unit configured to delay an output of the third divider by third delay time, and
   a duty-cycle corrector configured to correct the duty cycles of the outputs of the first delay unit and the third delay unit and output corrected results as first and second corrected clocks.

3. The apparatus of claim 2, further comprising:
   a phase separator configured to separate each of the first and second corrected clocks into two clocks having phases opposite to each other and output the two clocks.

4. The apparatus of claim 1, further comprising:

a filter configured to stabilize the output of the phase comparator and output the stabilized comparison result to the delay time setting unit.

5. The apparatus of claim 2, wherein each of the first to third dividers is configured to frequency-divide an input signal by two.

6. The apparatus of claim 1, wherein the second delay unit is modeled on a time required to read out data from the semiconductor memory apparatus.

7. The apparatus of claim 1, wherein the delay time setting unit comprises a shift register.

8. The apparatus of claim 3, wherein the duty-cycle corrector includes:

a fourth delay unit having a delay time and configured to delay the output of the third delay unit by a predetermined amount of time and produce an output;

a second delay time setting unit configured to set the delay time of the fourth delay unit;

a fifth delay unit having a delay time and configured to delay the output of the fourth delay unit by a predetermined time and produce an output;

a third delay time setting unit configured to set the delay time of the fifth delay unit;

an XOR logic element configured to perform an XOR operation on the outputs of the first and fifth delay units and produce an output;

a second phase separator configured to separate the output of the XOR logic element into two clocks having positive and negative phases and duties;

a duty detector configured to compare the duties of the two clocks having the positive and negative phases that are output from the second phase separator and outputs a comparison result; and a control unit configured to selectively control the second and third delay time setting units on the basis of the comparison result output from the duty detector.

9. The apparatus of claim 8, wherein the fourth and the fifth delay units are configured to have different unit delay times.

10. The apparatus of claim 8, wherein each of the second delay time setting unit and the third delay time setting unit comprises a shift register.

* * * * *